United States Patent [19]

Szczyrbowski et al.

[11] Patent Number: 5,286,360
[45] Date of Patent: Feb. 15, 1994

[54] APPARATUS FOR COATING A SUBSTRATE, ESPECIALLY WITH ELECTRICALLY NONCONDUCTIVE COATINGS

[75] Inventors: Joachim Szczyrbowski, Goldbach; Goetz Teschner, Gelnhausen; Siegfried Beisswenger, Alzenau, all of Fed. Rep. of Germany

[73] Assignee: Leybold Aktiengesellschaft, Hanau, Fed. Rep. of Germany

[21] Appl. No.: 909,591

[22] Filed: Jul. 7, 1992

[30] Foreign Application Priority Data

Jan. 29, 1992 [DE] Fed. Rep. of Germany .... 4202425.0

[51] Int. Cl.$^5$ .............................................. C23C 14/34
[52] U.S. Cl. .................................................. 204/298.08
[58] Field of Search ...................... 204/298.08, 192.12

[56] References Cited

U.S. PATENT DOCUMENTS

| | | | |
|---|---|---|---|
| 4,902,394 | 2/1990 | Kenmotsu et al. | 204/192.12 |
| 5,015,493 | 5/1991 | Gruen | 427/571 |
| 5,026,471 | 6/1991 | Latz et al. | 204/298.19 |
| 5,126,032 | 6/1992 | Szczyrbowski et al. | 204/298.08 |
| 5,192,894 | 3/1993 | Teschner | 315/111.21 |

FOREIGN PATENT DOCUMENTS

| | | | |
|---|---|---|---|
| 0416241 | 3/1991 | European Pat. Off. | 204/298.19 |
| 3919147 | 12/1990 | Fed. Rep. of Germany | 204/298.19 |
| 4010495 | 10/1991 | Fed. Rep. of Germany | 204/298.19 |
| 3-56671 | 3/1991 | Japan | 204/298.08 |

OTHER PUBLICATIONS

Patent Abstracts of Japan: 2-38566 A. C712, Apr. 23, 1990, vol. 14, No. 197.
3-61368 A. C-836, May 29, 1991, vol. 15, No. 211.

*Primary Examiner*—Aaron Weisstuch
*Attorney, Agent, or Firm*—Felfe & Lynch

[57] ABSTRACT

In a method and an apparatus for coating a substrate (26) with electrically nonconductive coatings from an electrically conductive target (25) in a reactive (e.g., oxidizing) atmosphere, with a cathode (17) disposed in an evacuable coating chamber (16) and electrically cooperating with the target (25), the cathode (17), for the purpose of suppressing arcs, is connected to a DC power source and can be brought to a positive potential for brief time periods by means of an additional circuit (22, and 3 to 15, respectively), the frequency of this periodical polarity reversal being adjustable, depending on the coating to be deposited 3 Claims, 2 Drawing Sheets $E = \frac{1}{2} Li^2, \quad E = \frac{1}{2} CU^2$

APPARATUS FOR COATING A SUBSTRATE, ESPECIALLY WITH ELECTRICALLY NONCONDUCTIVE COATINGS

FIELD OF THE INVENTION

The invention relates to a method and an apparatus for coating a substrate, especially with electrically nonconductive coatings, from electrically conductive targets in a reactive (e.g., oxidizing) atmosphere, comprising a direct-current source which is connected to a cathode enclosing at least one magnet and disposed in an evacuable coating chamber, the cathode cooperating electrically with the target, from which sputtered material deposits on the substrate, and at least one anode being disposed separately in the sputtering chamber.

DESCRIPTION OF THE PRIOR ART

An apparatus for the reactive coating of a substrate is described in a prior, unpublished patent application (P 41 36 655.7; an addition to P 40 42 289.5), in which a cathode electrically separated from the vacuum chamber, configured as a magnetron cathode, and consisting of two parts electrically separated from one another, in which the target base body with yoke and magnet is coupled as the one part—with the interposition of a capacitor—to the negative pole of a direct-current power source, and the target is coupled as the other part by a conductor and with the interposition of a choke and a resistor parallel thereto to the power supply, and the target is coupled through an additional capacitor to the positive pole of the power supply and to the anode which in turn—with interposition of a resistor—is coupled to ground, an inductor being inserted into the branch line to the resistor and to the choke in series with the low-induction capacitor, and the value of the resistance is typically between 2 K$\Omega$ and 10 K$\Omega$.

This apparatus is so configured that it suppresses the great majority of the arcs that occur during a coating process, reduces the energy of the arcs, and improves the reignition of the plasma after arcing.

In another prior patent (U.S. Pat. No. 5,192,894), a circuit for the extinction of arcs in plasma apparatus is provided in order to make high coating rates possible even when sputtering difficult materials, such as $SiO_2$. The momentary value of the voltage of the plasma circuit is compared with a voltage which corresponds to an average plasma voltage determined over a given period of time, and when the difference between the momentary value of the plasma voltage exceeds a given amount, the plasma circuit is cut off from the voltage source.

In the reactive sputtering of metal oxides or metal nitrides, the formation of more or less well insulating coatings on the target surface cannot be avoided. Such insulating coatings on the target are in contact with the plasma and therefore assume an electrical charge. On account of the high electric field strength in these thin layers, electrical breakdowns can occur. An arc is initiated in this manner. The consequences are pin-prick destruction of the target and thus coating defects on the substrate.

In the case of medium-frequency sputtering (as described in the prior German patent applications P 41 38 793.7 and P 41 38 794.5) it has been found that spontaneous arcing occurs with far less frequency than it does in normal DC sputtering. The peculiarity of the known method is that the cathodes are periodically reverse-charged in the rhythm of the medium frequency.

OBJECT AND SUMMARY OF THE INVENTION

Setting out from the experience gained with apparatus of medium-frequency sputtering, the present invention is addressed to the problem of improving an apparatus of the type in question and the corresponding method such that, even in the coating of very large substrates, the coatings sputtered on them will be further improved in their quality or freedom from flaws, which requires especially the greatest possible suppression of arcing.

This problem is solved in accordance with the invention in that a DC magnetron cathode connected to a DC power source can be periodically brought by means of a matching additional electronic circuit to a positive potential for short periods of time, and the frequency of this periodic polarity reversal—in accordance with the coating to be deposited—is adjustable.

Advantageously, the polarity reversal is performed through a bridge circuit formed of four semiconductors with a rectifying action, preferably thyristors, wherein the control electrodes of the thyristors are connected in pairs through pairs of control amplifiers with pulse formers and through these to a flip-flop element which in turn is in working connection through a logic gate, an OR gate for example, both with an arc detector and with a pulse generator. The DC power source is best connected with its one pole to the first branch of the measuring bridge, the first branch being connected to the cathode and the second branch to the anode.

The invention admits of a great variety of embodiments; one of them is represented in the appended drawings in a schematic manner.

DESCRIPTION OF THE PREFERRED EMBODIMENT

The polarity reversal of the cathode of a sputtering apparatus can be achieved by connecting a positively charged capacitor parallel to the discharge circuit of the DC magnetron through a thyristor bridge circuit.

Figure 1:
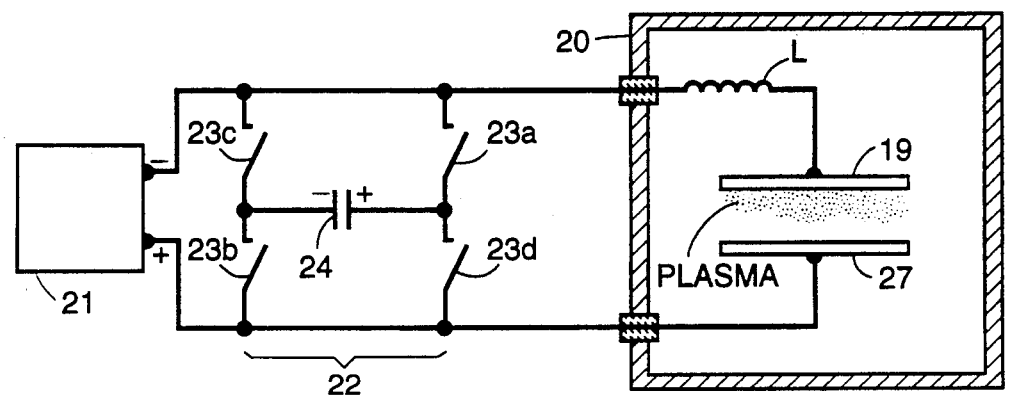
FIG. 1 is a highly simplified schematic electrical circuit for an apparatus of the kind in question.

Referring now more particularly to FIG. 1, FIG. 1 shows in a greatly simplified manner a magnetron cathode 19 disposed in a vacuum chamber 20 and connected to a direct-current source 21. Between the vacuum chamber 20 and the power source 21 a bridge circuit 22 is symbolized by four switches 23a, 23b, 23c, and 23d.

Figure 2:
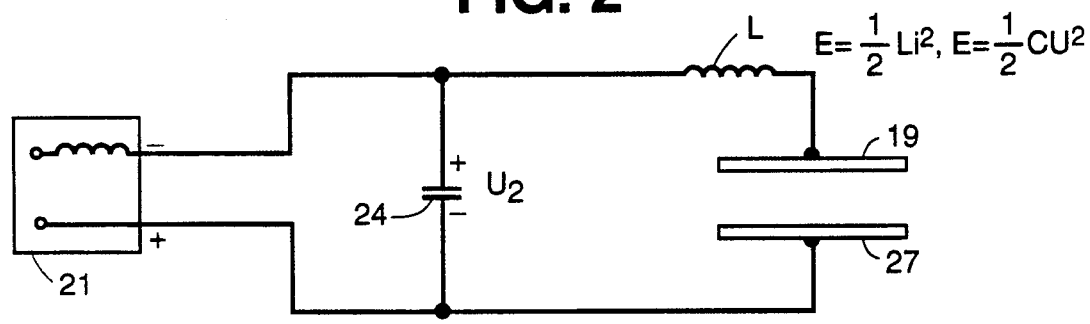
FIG. 2 is the equivalent schematic circuit for the circuit of FIG. 1.
Figure 3:
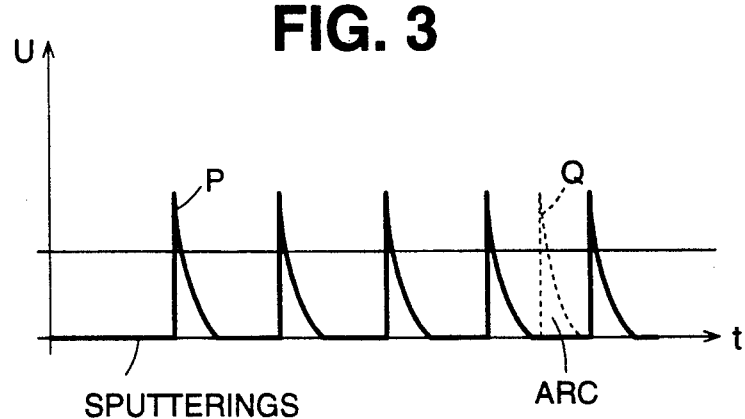
FIG. 3 is a diagram of the periodic polarity reversal of the cathode voltage as a function of time.

For example, if switches 23a and 23b are closed, the situation will be as represented in FIG. 2 (equivalent circuit of FIG. 1). Since previously the discharge current flowed through the inductor L to the cathode 19, the induction voltage $U_1$ is produced, which is the opposite of the polarity of the voltage $U_2$ of the condenser 24. $U_1$ is greater than $U_2$, since the inherent inductance in the first instant supplies precisely the voltage which can sustain the current that flowed previously. When the energy $\frac{1}{2} LI^2$ stored in the inductor is used up and the capacitor 24 is not yet discharged, a positive residual voltage appears at the cathode 19 (size conditions therefore: $\frac{1}{2} LI^2 < \frac{1}{2} CU^2$). At this moment the discharge at the cathode (sputtering magnetron) 19 has already vanished. Then the further discharge and reversed charging of the condenser 24 by the direct-current source 21 gains the upper hand. In this manner the condenser 24 is charged fully negatively. At the same time the voltage at the cathode 19 reaches the same negative level. The sputtering process accordingly is continued. The reverse-charged condenser 24 is ready for the next cycle of polarity reversal. This time the process is started by the closing of switches 23c and 23d.

Figure 4:
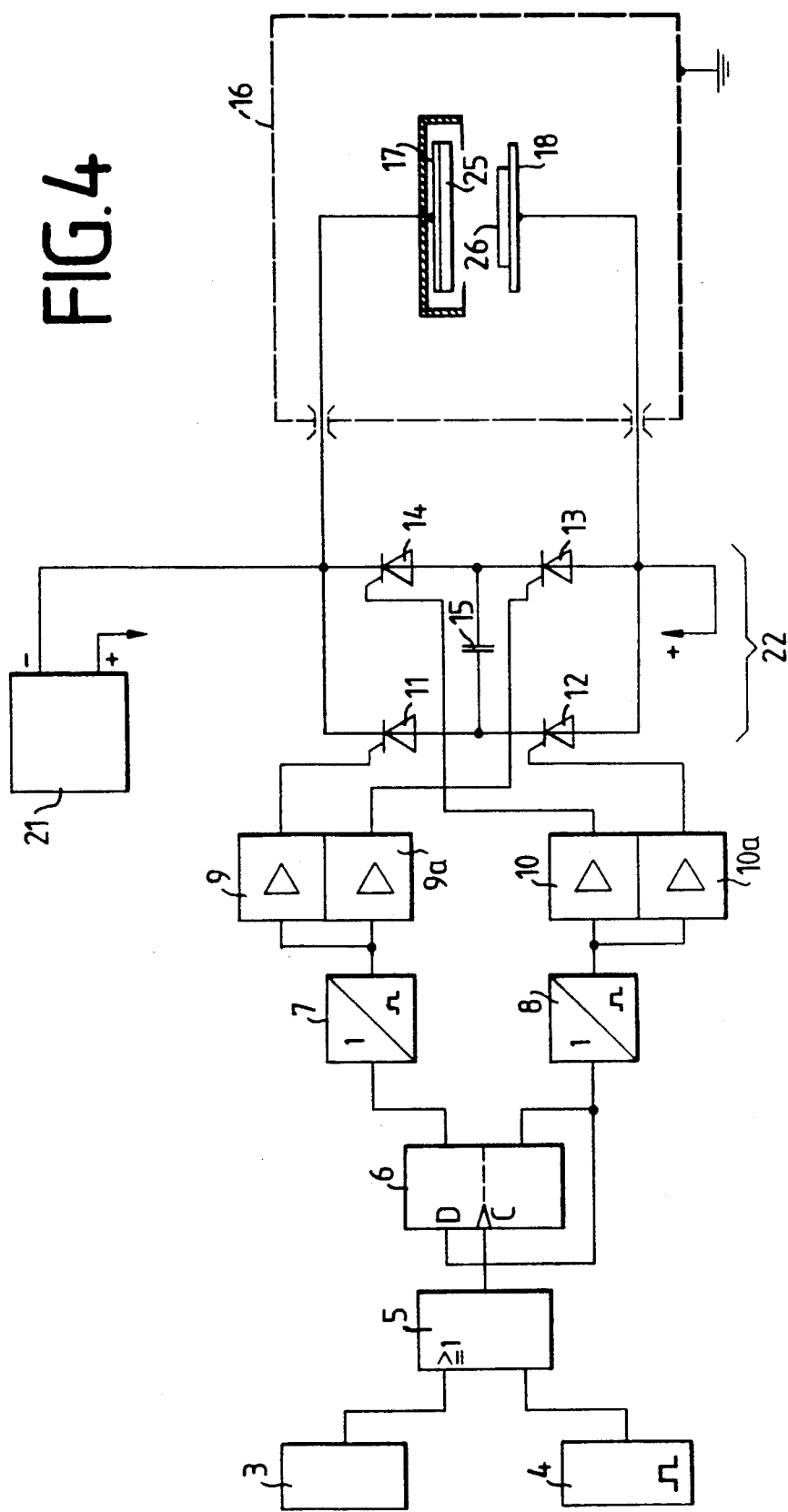
FIG. 4 shows the completed schematic block diagram of the circuit for the apparatus according to the invention.

This periodic process is brought about by operating the switches 23a to 23d in an appropriate manner by means of a pulse generator 4 and likewise known electronic circuits (see FIG. 4).

The polarity reversal process, however, can also be triggered by a so-called "spontaneous arc." Here an arc detection circuit, such as the one described, for example, in the prior German Patent Application P 41 27 504.7, takes over the function of operating the bridge circuit. At the same time the arc detector and the pulse generator ar connected (logically) parallel.

The voltage/time curve at the cathode 19 diagrammatically shows the periodic polarity reversal in the form of the curve P and the spontaneously occurring arc in the broken curve Q, U again representing the cathode voltage.

The block circuit diagram of FIG. 4 shows essentially an arc detector 3, a pulse generator 4, a logic gate 5 (OR gate) connected to these two elements, a flip-flop 6 connected to logic gate 5, two pulse formers 7 and 8 following the flip flop 6, operational amplifiers 9, 9a, 10, 10a following the pulse formers, bridge circuit 22 consisting of the thyristors 11 to 14 and the condenser 15, and the cathode-anode system 17, 18, provided in the vacuum chamber 16.

The semiconductor bridge 22 represented in FIG. 4 comprises four thyristors 11, 12, 13, and 14, and a condenser 15, and thus represents a practical example of the embodiment of the circuit shown merely in principle in FIG. 1. The pulse generator 4 produces pulses with a duration of about 5 μs and a repeat frequency of 1 Hz to about 1 kHz.

Part of the cathode 17 is the target 25, the substrate 26 is on the anode 18, and the power supply 21 is connected to the bridge circuit 22 (the substrate 26 can also be arranged so as to float, i.e., to be situated between parts 17 and 18).

The arc detector 3 represented diagrammatically in FIG. 4 is a circuit in which the momentary value of the voltage of the plasma section is compared with a voltage level corresponding to an average plasma voltage determined over a given period of time, in which case, when the difference between the momentary value, the plasma voltage and the average plasma voltage exceeds a given level, the plasma section is cut off from the voltage source.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Apparatus for coating a substrate, especially with electrically non-conductive coatings, from an electrically conductive target in a reactive atmosphere, comprising: an evacuable coating chamber, a direct-current source, a magnetron cathode disposed in the evacuable coating chamber and containing a target and a magnet, which cooperates electrically with the target which is sputtered and whose sputtered particles deposit themselves on the substrate, said cathode being electrically connected to said direct-current source, an anode separated electrically from the sputtering chamber, said apparatus further including an additional circuit which brings said DC magnetron cathode periodically for brief periods of time individually of the order of microseconds to a positive potential, the frequency of this periodical change of polarity being adjustable in accordance with the coating material that is to be deposited.

2. Apparatus according to claim 1, in which the additional circuit includes a bridge circuit which includes four thyristors with rectifying action, pairs of operational amplifiers, pulse formers, a flip-flop, a logic circuit, an arc detector, and a pulse generator, the control electrodes of the thyristors being coupled in pairs through the pairs of operational amplifiers to the pulse formers, and by the latter to the flip-flop, which in turn is actively coupled through the logic circuit both with said arc detector and said pulse generator, the additional circuit performing the periodical reversal of the polarity.

3. Apparatus according to claim 2, in which the direct-current source has two poles and is connected at one pole thereof to a first branch of the bridge circuit and at another pole thereof to a second branch of the bridge circuit, the first branch being connected to the cathode and the second branch to the anode.

* * * * *